United States Patent [19]

Hashimura et al.

[11] Patent Number: 4,841,857
[45] Date of Patent: Jun. 27, 1989

[54] THIN-FILM FORMING APPARATUS

[75] Inventors: Yasuhiro Hashimura, Kyoto; Satoshi Noguchi, Ootsu; Nobuyuki Minami, Kyoto, all of Japan

[73] Assignee: Nissha Printing Co., Ltd., Kyoto, Japan

[21] Appl. No.: 130,357

[22] PCT Filed: Mar. 3, 1987

[86] PCT No.: PCT/JP87/00134
§ 371 Date: Oct. 29, 1987
§ 102(e) Date: Oct. 29, 1987

[87] PCT Pub. No.: WO87/05264
PCT Pub. Date: Sep. 11, 1987

[51] Int. Cl.4 .............................................. B41F 9/00
[52] U.S. Cl. .................................................... 101/158
[58] Field of Search ............... 101/150, 170, 158, 161, 101/157, 169, 212, 250

[56] References Cited

U.S. PATENT DOCUMENTS 3,098,435  7/1963  Flower et al. ...................... 101/212
3,164,088  1/1965  Vechot .
3,842,738 10/1974  Terrazas et al. .................... 101/158
4,262,034  4/1981  Andersen ..................... 427/419.2 X
4,503,769  3/1985  Andersen ............................ 101/170

FOREIGN PATENT DOCUMENTS 53-43204 10/1978 Japan .
59-155047  9/1984 Japan .
60-131861  7/1985 Japan .
61-12396   1/1986 Japan .
1289609    9/1972 United Kingdom .

Primary Examiner—J. Reed Fisher
Attorney, Agent, or Firm—Wenderoth, Lind & Ponack

[57] ABSTRACT

The present invention relates to an apparatus for forming a thin film on a material by printing. The apparatus is characterized in that it has a cylindrical intaglio roller. The ink deposited on the surface of the intaglio roller is first transferred onto the surface of a printing roller, and then is printed on the surface of the material to be printed which is disposed on a surface plate. Alternatively, the ink is directly printed on the surface of the material to be printed without employing the printing roller. Since the intaglio roller has a cylindrical body, the surface of the roller can be precisely and easily machined and finished. Accordingly, despite a plurality of ink cells directly formed in a given pattern on the surface of the intaglio rollers, the contact pressure of the ink cell surface of the intaglio roller against the surface of the printing roller or the surface of the material to be printed is uniform over the entire contact area so that the thickness of the film printed on the surface of the material to be printed can be made precisely uniform over the entirety thereof.

10 Claims, 5 Drawing Sheets

THIN-FILM FORMING APPARATUS

FIELD OF THE INVENTION

The present invention relates to a thin-film forming apparatus for printing and forming various thin films such as crystalline liquid orientated film, photoresist film, crystalline liquid-filling seal, and insulation coating for a semiconductor device.

DESCRIPTION OF THE RELATED ART

In general, an offset printing method is the conventionally used method for printing a thin film onto materials such as paper. However, the offset printing method utilizes, as is well known, the non-hydrophilic property of the printing ink against dampening water; accordingly, the printing ink transferred from an ink-kneading roller requires resistance against being emulsified in the dampening water; and thus, the degree of ink viscosity is restricted to only a high viscosity ranging from 80,000 to 100,000 c.p.s.

Consequently, it has not been possible to print, for example, thin films requiring ink having a low viscosity ranging from approximately 4 or 5 to 30,000 c.p.s., such as crystalline liquid oriented film, photoresist film, and crystalline filling seal, onto thin materials such as a glass plate, a ceramic plate, and plastic film.

The applicant of the present invention has already provided a thin-film forming apparatus as shown in FIG. 16 (See Japanese first Utility Model Publication No. 170864/1983). According to this apparatus, an intaglio or gravure plate 32 having a multiplicity of ink calls arranged in a given pattern thereon, and material to be printed 33 are placed on a base body 31. A printing roller support 35 which supports a printing roller 34 and an ink-supplying device (not shown in the drawing), installed near the intaglio plate 32, for dispensing ink composed of a high polymer solution having a viscosity ranging from approximately 50 or 60 to 30,000 c.p.s. into ink cells of the intaglio plate 32, are arranged above the base body 31 so as to move between the intaglio plate 32 and the material to be printed 33. Furthermore, a doctor 36 which scrapes off excessive amount of ink filling the ink cells of the intaglio plate 32 is fixed to the printing roller support 35.

In this apparatus, after the excessive ink supplied from the ink-supplying device and into ink cells of the intaglio plate 32 is scraped off, the printing roller 34 is rotated while contacting the intaglio plate 32, and the ink disposed in the ink cells of the intaglio plate 32 is deposited in a given pattern on the surface of a soft synthetic-resin-made convex portion 34a formed on the surface of the printing roller 34. Then, the printing roller 34 on which ink is deposited, is moved onto the surface of the material 33 and the ink deposited on the convex portion 34a is printed onto the surface of the material 33 while the printing roller 34 is rotated; thus a desired pattern is formed on the material 33.

To fabricate the above-described intaglio plate 32, the intaglio plate 32 is composed only of a planar plate and a given pattern is directly formed on the surface of the plate. In such a case, the production cost is relatively great, and the plate must be totally replaced each time a patter is changed, thus resulting in especially complicated operating procedures. Therefore, in the conventional apparatus as described above, the intaglio plate 32 is constructed so that a transfer plate 32b is removably fastened on the upper surface of a surface plate 32a and the surface of the transfer plate 32b is coated with various thin plating; and thus, a given pattern is formed.

According to the above-described device, however, it is difficult to precisely and flatly arrange the transfer plate 32a over entire area of the surface plate 32a, and the upper surface of the transfer plate 32b tends to become warped, resulting in difficulty in maintaining, at a specified level, the contact pressure between the transfer plate 32b and convex portion 34a formed on the surface of the printing roller 34. Consequently, it is difficult to transfer a given pattern with a uniform thickness onto the convex portion 34a formed on the surface of the printing roller 34. In turn, it is difficult to form the thickness of the printed film formed on the material to be printed 22 at a specified value.

SUMMARY OF THE INVENTION

The object of the present invention is, therefore, to remedy the above-described disadvantages and to provide a thin-film forming system which can precisely print and form a thin film having a given pattern with a specified thickness.

In order to achieve the above-described object, according to one feature of the present invention, there is provided a thin-film forming apparatus comprising an intaglio plate, for supplying a specified amount of ink to the printing roller, comprising a cylindrical body instead of a plate body. A multiplicity of ink cells are formed in a given pattern on the surface of the cylindrical body, i.e. the intaglio roller or gravure roller. This thin-film forming apparatus comprises: a base body having a supporting means; an intaglio roller which is rotatably supported by teh supporting means and has a plurality of ink cells arranged in a given patter on its surface; an ink supplying means which supplies ink onto the surface of the intaglio roller; a doctor which is fixed at a specified position over the intaglio roller to spread the ink supplied to the surface of the intaglio roller over the surface thereof and to maintain a given amount of ink in the ink cells; a printing roller rotatably supported by the supporting means below the intaglio roller and having a convex portion, which contacts the intaglio roller, and which transfers the ink deposited in the ink cells arranged in a given pattern on the surface of the intaglio roller onto material to be printed; a first driving means which is supported by the supporting means, and which rotates the printing roller and the intaglio roller in synchronization with each other; a surface plate functioning as a printing stage and which is mounted on the base body and has a top surface on which the material to be printed is placed; a second driving means for moving the surface plate along the base body between an insertion posittion, a printing position, and an output position for the material to be printed; and a control means which controls the rotation of the printing roller and the movement of the surface plate, so that the ink transferred onto the convex portion of the printing roller is printed in a given pattern on the surface of the material to be printed.

In the above-described apparatus, ink is supplied from the ink-supplying means onto the surface of intaglio roller. The doctor causes the ink cells of the intaglio roller to be filled with a given amount of ink when the intaglio roller is rotated by means of the first driving means. Subsequently both the intaglio roller and printing roller are rotated by the first driving menas so that the ink deposited in the plurality of ink cells arranged in a given pattern on the surface of the intaglio roller is transferred onto the surface of the concave portion of the printing roller. Then, the second driving means is controlled by the control means such that it moves the surface plate, on which the material to be printed is placed, toward the printing position on the base body. Therefore, the convex portion of the printing roller and the surface of the material to be printed contact each other; and thus, the ink deposited onto the surface of the convex portion is printed onto the surface of the material to be printed.

In general, the surface of a cylindrical body is much more precisely machined as compared to that of a flat plate. Accordingly, the surface of the intaglio roller on which a given pattern is to be formed can be precisely finished. If a multiplicity of ink cells to be arranged in a given pattern are directly formed on the surface of the intaglio roller, the contact pressure between the convex portions of the printing roller and the surface of the intaglio roller on which a given pattern is formed tends to be uniform over the entire area therebetween, and the thickness of the printed film on the material to be printed can be made precisely at a specified value over the entire area. Also, the transfer of the ink deposited in a given pattern in the ink cells of the intaglio roller onto the surface of the material to be printed is carried out by means of the printing roller having a soft convex poriton, thereby providing an advatageous condition for forming a thin film on brittle material to be printed, such as a glass plate. Furthermore, the viscosity of the ink to be used should range from approximately 50 or 60 c.p.s. to 30,000 c.p.s., more preferably from 40 c.p.s. to 10,000 c.p.s.

According to another feature of the present invention, there is provided a thin-film forming apparatus which does not employ a printing roller having the above-described construction so that printing is directly carried out by the intaglio roller. This thin-film forming apparatus comprises: a base body having a supporting means; an intaglio roller which is rotatably supported by the supporting means and has a plurality of ink cells arranged in a given pattern on its surface; an ink supplying means which supplies ink onto the surface of the intaglio roller; a doctor which is fixed at a specified position over the intaglio roller to spread the ink supplied onto the surface of the intaglio roller over its surface and to cause a given amount of ink to be maintained in the ink cells; a first driving means which is supported by the supporting means to rotate the intaglio roller; a surface plate which is mounted on the base body and has an elastic top surface on which the material to be printed is placed; a second driving means for moving the surface plate between an insertion position, a printing position, and an output position for the material to be printed; and a control means which controls the rotation of the intaglio roller and the movement of the surface plate, so that the ink deposited in the intaglio roller in a given pattern is printed onto the surface of the material to be printed.

In the above-described embodiment, ink is supplied from the ink-supplying means onto the surface of the intaglio roller. The intaglio roller is rotated by the first driving means; at the same time, the doctor causes the ink cells of the intaglio roller to be filled with a given amount of ink by spreading the ink over the surface of the intaglio roller. The surface plate which supports the material to be printed is moved to the printing position on the base body, i.e. a position located below the printing roller, by the second driving means through the control means. Then, the ink deposited in the plurality of ink cells arranged in a given pattern on the surface of the intaglio roller is printed onto the surface of the material to be printed by making the intaglio roller and the surface of the material to be printed contact each other.

In general, the surface of a cylindrical body is much more precisely machined as compared to that of a flat plate. Accordingly, the surface of the intaglio roller on which a given pattern is to be formed can be precisely machined and finished. In addition, since the top surface of the surface plate is elastic, i.e. an elastic body is mounted on the surface of the surface plate, the contact pressure of the intaglio roller and the material to be printed tends to be uniform over the entire area therebetween, resulting an appropriate printing pressure. Also, the ink deposited in a given pattern in the ink cells of the intaglio roller is transferred directly onto the surface of the material to be printed without using the printing roller, thus providing an advantageous condition for forming a thin film on a soft material to be printed such as a plastic film. Furthermore, the applicable viscosity o the ink to be used ranges from 5 or 6 c.p.s. to 100 c.p.s., more preferably from 5 c.p.s. to 50 or 60 c.p.s.; and thus, the use of ink having a relatively low viscosity is possible.

DETAILED DESCRIPTION OF THE PREFERRED EMBODIMENTS

Referring now to the accompanying drawings the embodiments of the present invention will be described in detail below.

EMBODIMENT 1

Figure 1:
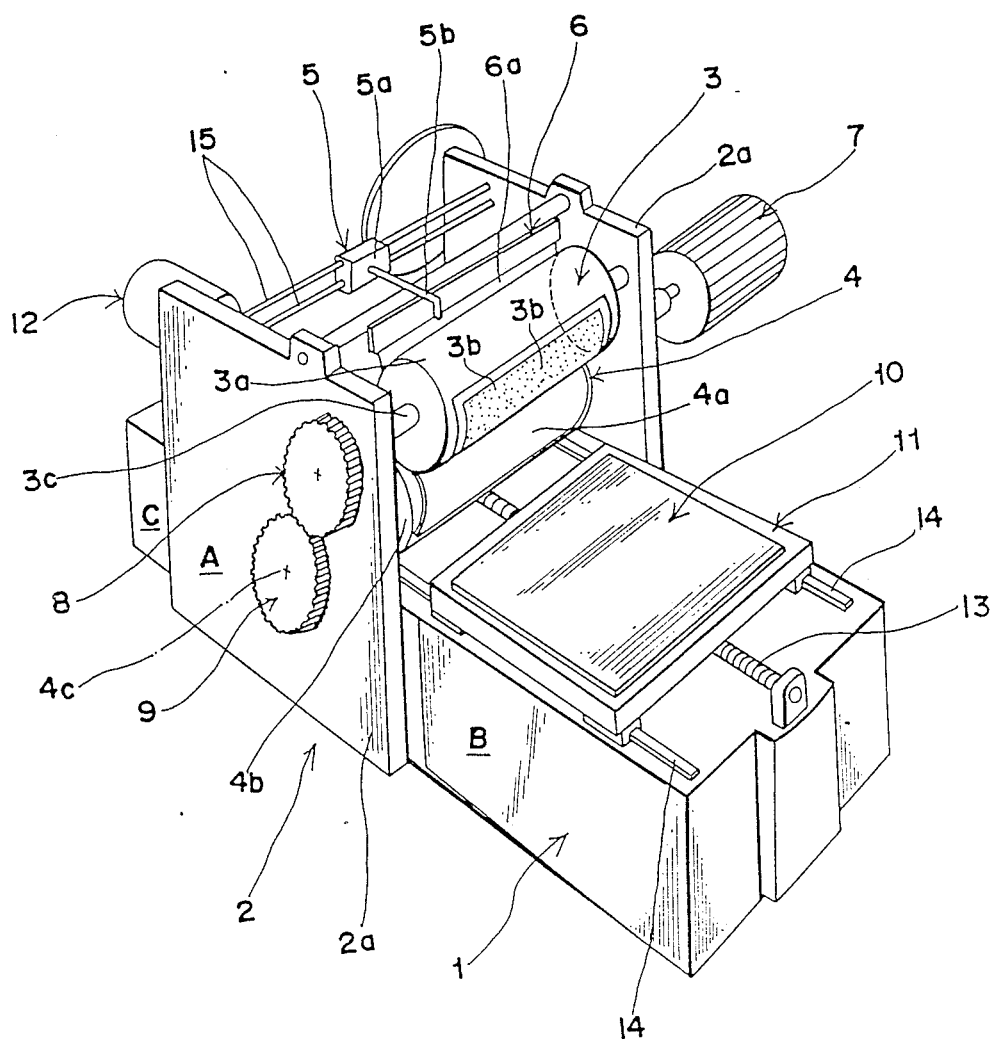
FIG. 1 is a perspective view of a thin-film forming apparatus according to an embodiment of the present invention.

A thin-film forming apparatus according to a first embodiment of the present invention has, as shown in FIG. 1, a base body 1 with a a housing 2 which supports an ink-supplying device 5, a doctor 6, an intaglio roller 3, a printing roller 4, and a device for driving the printing roller, i.e., a motor 7 for driving the printing roller. When the motor 7 is driven, gears 8 and 9 engaging with each other cause synchronous rotation of the printing roller 4 and the intaglio roller 3. On the base body 1, a surface plate 11 for supporting a material to be printed 10 thereon, such as a glass plate is movably mounted; also, the surface plate 11 is mounted so as to be movable on the base body 1 by a rotating ball screw 13 which is driven by a device for driving material to be printed, i.e., a motor 12 for driving material to be printed. The surface plate 11 is, as shown in FIG. 1, first moved from an insertion position B to a printing position A for the material to be printed; then ink is supplied from the ink-supplying device 5 onto the intaglio roller 3, and excessive ink deposited on the intaglio roler 3 is scraped off by means of a doctor. The ink deposited in a given pattern on the surface of the intaglio roller 3 is transferred onto the surface of the printing roller 4. Next, the printing roller 4 is made to contact the surface of the material 10 to be printed positioned at the printing position A thereof, whereby a thin film having a given pattern is printed and formed on the surface of the material 10 to be printed. Then, the material 10 to be printed placed on the surface plate 11 is moved to an output position C by means of the motor 12 for driving a material to be printed, whereby the material 10 to be printed is outputted. The surface plate 11 is then slightly lowered by height-adjusting means (not illustrated) and is returned to the insertion position B through the output position C and the printing position A by the motor 12 for driving the material to be printed. During the operation described above, the rotation of the intaglio roller 3 and the printing roller 4, and the movement of the surface plate 11 are controlled by the control means.

Each component member is further described in detail below.

The housing 2 comprises a pair of supporting plates 2a which are mounted at a specified location on the central portion of the rectangular parallel-piped base body 1 so as to face each other. The intaglio roller 3 is rotatably supported by the upper portion of the housing 2 which comprises the pair of supporting plates 2a and the above-described printing roller 4 is rotatably supported by the housing 2 at a location that is lower than and diagonal from the intaglio roller 3. Also, the doctor 6 in contact with the surface of the intaglio roller 3 is fixed at the upper end portion of the housing adjacent to the intaglio roller 3. The ink-supplying device 5, positioned over a doctor blade 6a of doctor 6, supplies ink into the surface of the intaglio roller 3.

The ink-supplying device 5 is equipped with a pair of rails 15 which are installed at the upper end of the housing, i.e. at the opposite side of the doctor 6 with respect to the intaglio roller 3. An ink-supplying body 5a is movably mounted on rails 15 and an ink nozzle 5b of the ink-supplying body 5a extends over the doctor 6 and over the surface of the intaglio roller 3. The ink-supplying body 5a consecutively supplies ink onto the surface of teh intaglio roller 3 during movement along the pair of the rails 15, driven by means of a motor or air cylinder with the aid of a wire which is not illustrated. The ink supplied onto the surface of the intaglio roller 3 has a viscosity range from 50 to 60 c.p.s. to 30,000 c.p.s., and which is composed of a mixture of synthetic resin, resin precursor, solvent, and so on.

Figure 15:
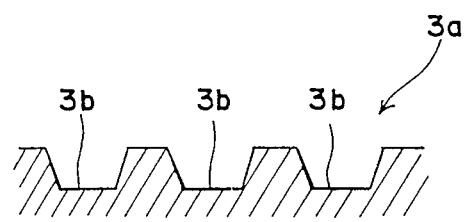
FIG. 15 is a sectional view showing ink cells formed on the surface of an intaglio roller of the apparatus shown in FIG. 1 and FIG. 2.
Figure 16:
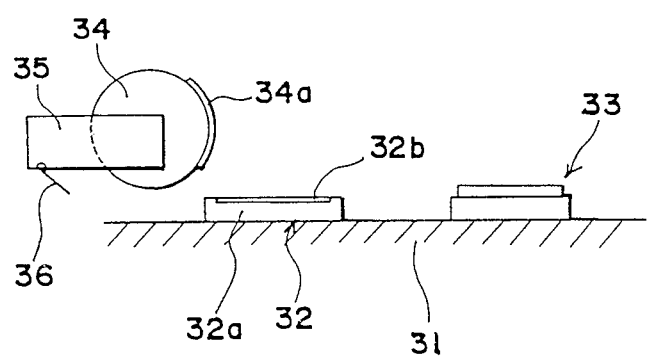
FIG. 16 is a sectional view of a conventional thin-film forming apparatus.

The intaglio roller 3 comprises a roller body 3a which is mounted on a rotation shaft 3c; the roller body 3a comprises a steel core member on which a plated layer is formed. A multiplicity of ink cells arranged in a given pattern, as shown in FIG. 15, are formed on the surface of the plated layer. These ink cells 3b have, for example, a depth ranging from 10 to approximately 50 or 60 microns, and the configuration of the ink cells is designed according to the pattern to be formed. Both ends of the rotation shaft 3c of the intaglio roller 3 are rotatably supported by the supporting plates 2a and 2a of the housing 2; a primary gear 8 is mounted on the end of the rotation shaft 3c which protrudes outward from the supporting plate 2a of the housing 2; the roller body 3a supported by the rotation shaft 3c assumes a state of pressing contact with a convex portion 4a formed on the surface of a roller body 4b of the printing roller 4 under a specified pressure.

The intaglio roller 3 may be an intaglio roller made of ceramics, or more preferably, made of a metal coated with ceramics. By using such an intaglio roller as described above, not only is the abrasion resistance of the intaglio roller 3 greatly improved, but also no impurities result, such as a metal elute from the intaglio roller 3, which is especially preferable in forming a thin film which requires electric characteristics, such as an insulation coating for a semiconductor device and a crystalline liquid orientated film. The above-described ceramic intaglio roller can be made by means of a press method or an injection molding method. The above-described intaglio roller coated with ceramics can be made by means of coating ceramics onto the surface of a metal intaglio roller using an ion-plating method or a sputtering method.

The doctor 6 comprising doctor blade 6a is driven by an air cylinder (not illustrated) to move between a position contacting the intaglio roller 3 and a position disposed away from the intaglio roller 3; the blade 6a contacts the surface of the intaglio roller 3 so that the ink supplied onto the surface of the intaglio roller 3 is spread over its surface so the ink cells 3b formed on the surface of the intaglio roller 3 are filled with ink. The doctor blade 6a, like the intaglio roller 3, is preferably a ceramic doctor blade or a doctor blade coated with ceramics.

Also, the roller body 4b of the printing roller 4 is fixed to a rotation shaft 4c; the soft convex portion 4a, made of rubber such as butylene-isoprene rubber, synthetic resin such as nylon resin, photosensitive rubber, or photosensitive resin is provided at a specified location disposed along the circumferential surface of the roller body; and the ink deposited in a given pattern on the surface of the intaglio roller 3 is transferred onto the surface of the convex portion 4a. Both ends of the rotation shaft 4c are rotatably supported by the supporting plates 2a; and secondary gear 9 is mounted on the end of the rotation shaft 4c which protrudes outwardly from one supporting plate 2a of the housing 2, permitting the secondary gear 9 and the primary gear 8 to engage with each other. The motor 7 for driving the printing roller is mounted on the other end of the rotation shaft 4c which protrudes outwardly from the other supporting plate 2a of the printing roller 4. Accordingly, when the printing roller 4 is driven and rotated by the motor 7 for driving the printing roller, the intaglio roller 3 and the printing roller 4 rotate synchronously because of the engagement of the secondary gear 9 and the primary gear 8.

On the other hand, the surface plate 11 is mounted on the base body 1. Guide rails 14 are fixed at both sides of the top surface of the base body 1, extending from the printing position A, through the insertion position B and to the output position C. The surface plate 11 can move on the base body 1 in the longitudinal direction along the guide rails 14 over a range from the position A, position B, and position C. Sheet-shaped material 10 to be printed is placed and positioned on the top surface of the surface plate 11. In the central portion of the top surface of the base body 1, a ball screw 13 is rotatably mounted so as to extend in a longitudinal direction and is connected to the surface plate 11; the motor 12 for driving the material to be printed is connected to one end of the ball screw 13; and the ball screw 13 rotates in opposite rotational directions by being driven by the motor 12, allowing the surface plate 11 to move forwardly and backwardly along the guide rails 14 on the base body 1 thereof. The material 10 to be printed contacts the printing roller 4 at the printing position A of the surface plate 11, and the ink deposited in a given pattern on the surface of the printing roller 4 is transferred onto the surface of the material 10, i.e. the material 10 is printed.

Figure 3:
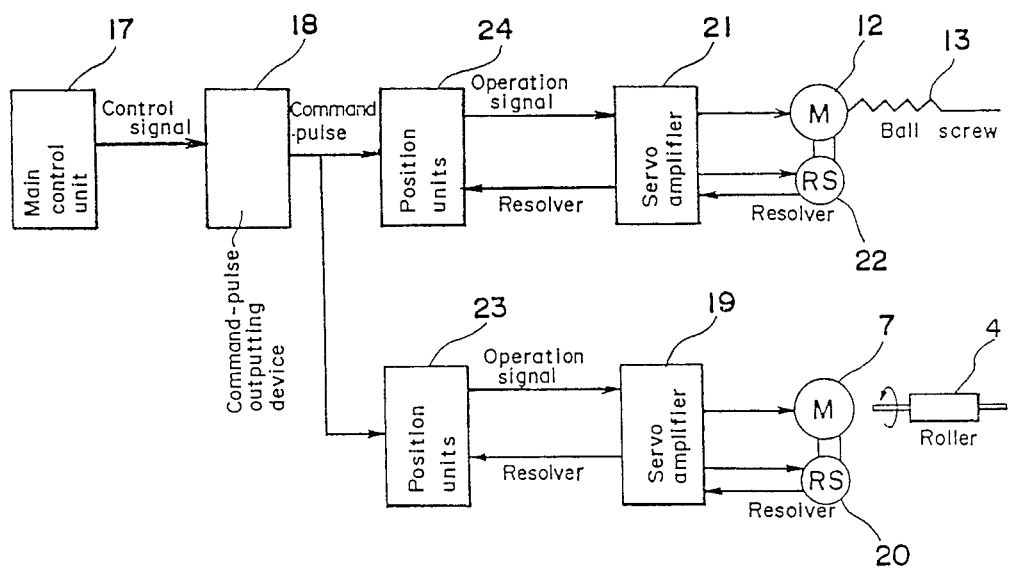
FIG. 3 is a block diagram of a control means of the apparatus shown in FIG. 1 and FIG. 2.

The motor 7 for driving the printing roller and the motor 12 for driving the material to be printed are controlled by the control device shown in FIG. 3; thus, the rotation of the printing roller 4 and the movement of the material to be printed 10 are controlled thereby.

As shown in FIG. 3, when a control signal is outputted from a main control unit 17 to a command-pulse outputting device 18, a command pulse is outputted from the command-pulse outputting device 18 to positioning units (devices for positioning) 23 and 24 of the motors 7 and 12, from which an operation signal is outputted into servo amplifiers 19 and 21. The servo amplifier 19 positioned on the printing roller side drives the motor 7 for driving the printing roller in accordance with the above-described operation signal, permitting the printing roller 4 to rotate over a specified number of degrees of angular rotation. The amount of rotation and the rotational speed of the motor 7 are detected by the resolver 20, and the detection results are fed back to the servo amplifier 19 and positioning unit 23. On the other hand, the motor 12 for driving the material to be printed, and the ball screw 13 are rotated by the operation signal inputted into the servo amplifier 21 positioned on the side of the material to be printed, allowing the material 10 to be printed to move to a given position on the base body 1. The amount of rotation and the rotational speed of the motor 12 are detected by the resolver 20, and the detection results are fed back to the servo amplifier 21 and positioning unit 24. Positioning units 23 and 24 adjust the output of the subsquent operation signal according to the values fed back.

Figure 4:
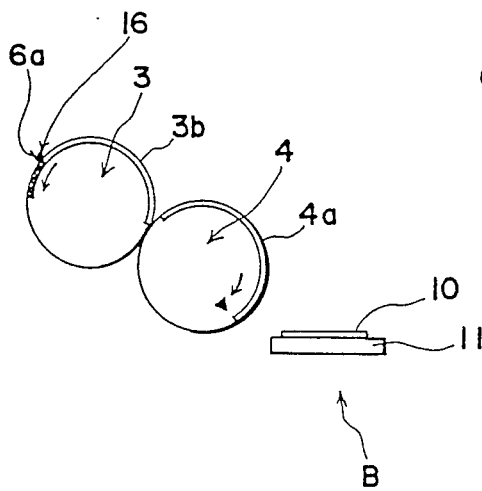
FIGS. 4 through FIG. 9 are schematic diagrams illustrating, in turn, printing steps performed by the thin-film forming apparatus shown in FIG. 2.
Figure 5:
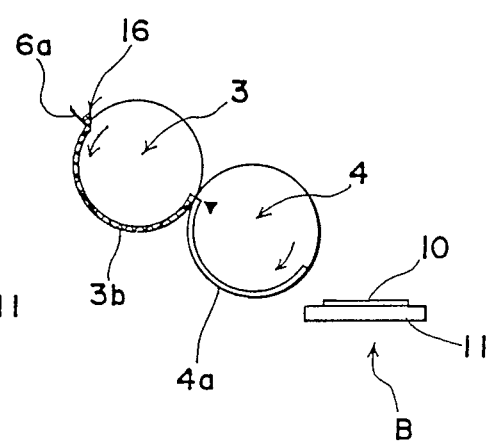
Figure 6:
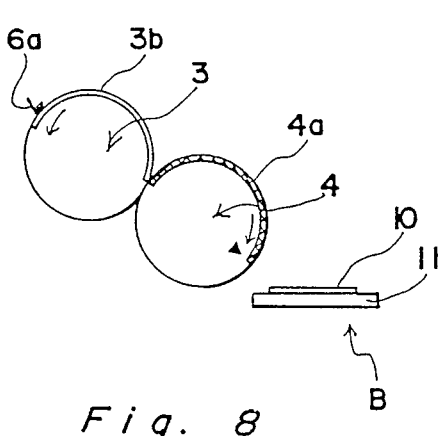
Figure 7:
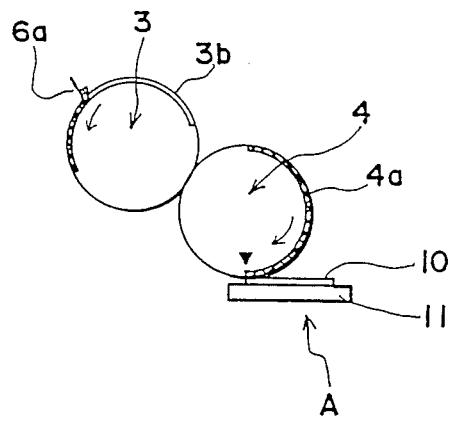
Figure 8:
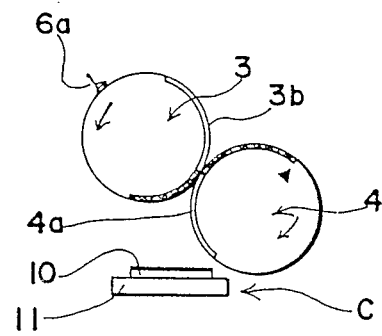
Figure 9:
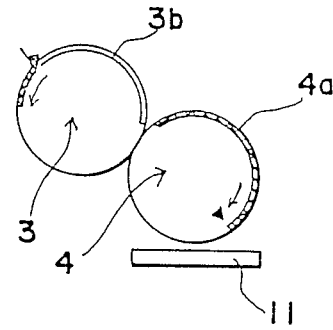

In the above-described embodiment, as shown in FIG. 4, ink cells 3b having a given pattern are first formed on the surface of the intaglio roller 3, then ink 16 is supplied by the ink-supplying device 5 from a position located over the doctor 6 onto the surface of the intaglio roller 3. Next, motor 7 for driving the printing roller is driven and rotated, causing the secondary gear 9 and primary gear 8 of printing roller 4 to be driven in meshing engagement; whereby the intaglio roller 3 synchronously rotates with above-described printing roller 4. Through this process, as shown in FIG. 5, ink 16 is spread over the surface of the intaglio roller 3 by means of the doctor blade 6a mounted on doctor 6; and a given amount of ink 16 thus consecutively fills ink cells 3b. When the intaglio roller 3 rotates and ink cells 3b formed in a given pattern contact convex portion 4a of printing roller 4, convex portion 4a slightly deforms and contacts the portion of intaglio roller 3 at which ink cells 3b are formed in a given pattern 3, permitting ink 16 deposited in ink cells 3b formed on the surface of the intaglio roller 3 to be transferred onto the surface of the above-described convex portion 4a. Next, as shown in FIG. 6, after ink 16 is totally transferred onto the convex portion 4a of the printing roller 4, and when the printing roller 4 rotates and the above-described convex portion 4a confronts the base body 1, the motor 12 for driving the material to be printed is driven by the control device so as to rotate the ball screw 13, whereby the surface plate 11 on which the material 10 to be printed is placed is moved from the insertion position B to the printing position A on the base body 1. At this time, the portion of the intaglio roller 3 on which ink cells 3b are formed is rotating synchronously with the printing roller 4 and faces the doctor 6. Then, ink 16 is supplied by the ink-supplying device from the position located over the doctor 6 onto the surface of intaglio roller 3. After positioning the convex portion 4a of the printing roller 4 and the material 10 to be printed as shown in FIG. 7, the motor 7 for driving the printing roller 4 and the motor 12 for driving the surface plate 11 are synchronously driven by the control device; the material 10 to be printed is moved to the output position C while printing roller 4 is rotating, and the convex portion 4a of the printing roller 4 slightly deforms under the contact thereof with the surface of the material 10 to be printed, wherein ink 16 deposited in a given pattern on the convex portion 4a is transferred to the surface of the material 10 to be printed. At this time, the intaglio roller 3 is rotated by means of rotating the above-described printing roller 4, thereby spreading ink 16 supplied onto the intaglio roller 3 by means of the doctor blade 6a of doctor 6. Next, as shown in FIG. 8, when the material 10 to be printed is printed with ink 16 in a given pattern, the ball screw 13 is rotated by means of the motor 12 so that the surface plate 11 is moved to the output position C, whereby the material to be printed 10 is fed from the surface plate 11 to the next processing position. As shown in FIGS. 8 and 9, after the surface plate 11 is moved to the next processing position, the printing roller 4 and the intaglio roller 3 are synchronously rotated by being driven by motor 7, whereby the ink 16 deposited in ink cells 3b formed on the surface of the intaglio roller 3 is transferred onto the surface of the convex portion 4a of the printing roller 4 in preparation for the next printing process. The surface plate 11, from which the printed material has been outputted, is moved from the output position C to the insertion position B with the aid of the ball screw 13 rotated by means of the driving device of motor 12. Thus the next material 10 to be printed is placed on the surface plate 11.

In general, according to the above-described embodiment, the surface of the cylindrical body or column-shaped body are much more precisely machined compared with that of the flat plate. Accordingly, the surface of the intaglio roller 3 on which a given pattern is to be formed can be precisely finished. Therefore, if a multiplicity of ink cells 3b arranged in a given pattern are directly formed on the surface of the intaglio roller 3, the contact pressure between the convex portions 4a of the printing roller 4 and the surface of the intaglio roller 3 on which a given pattern is formed, tends to become uniform over the entire area therebetween, and the thickness of the printed film to be printed on the material to be printed can be made precisely at a specified value over the entire area. Also, since the printing roller 4 and intaglio roller 3 are designed to rotate synchronously by motor 7 for driving the printing roller, the synchronous rotation mechanism of both rollers 4 and 3 has a simple structure. Furthermore, when the intaglio roller 3 is replaced with another intaglio roller 3 having a different pattern, and is mounted to the housing 2, the pattern-exchange operation is simple and secure, thereby eliminating the problem associated with a deviation of the positional relationship between the convex portion 4a of the printing roller 4 and the material to be printed. In addition, since a rack-and-pinion mechanism is not employed for moving the base body 1 and surface plate 11, the position at which the convex portion 4a of printing roller 4 contacts the material 10 to be printed is not offset from the correct position due to the backlash between the rack and pinion, and no density difference is generated on the printed film due to the fluctuation of contact pressure of the convex portion 4a and the material 10 to be printed, such backlash and fluctuation usually being caused by the engagement of the rack and pinion. Furthermore, the metal powder generated by the engagement of the rack and pinion or the lubricant of the rack and pinion are not introduced in the printed film of the material 10 to be printed. Moreover, the printed material 10 moves on the base body 1 from the insertion position located at one end of the base body 1 to the output position located on the other end of the base body 1. Therefore, unlike the conventional thin-film forming apparatuses, the insertion position and the output position for the material to be printed are not identical positions on the base body 1. Accordingly, the insertion and output operation of the material 10 to be printed are smoothly carried out, and the efficiency of the printing operation can also be improved.

EMBODIMENT 2

The thin-film forming apparatus according to embodiment 2 is basically the same as that according to embodiment 1; however, the printing roller 4 in embodiment 1 is not included in embodiment 2; and instead the intaglio roller performs the function of printing, whereby the material to be printed is directly printed.

Figure 2:
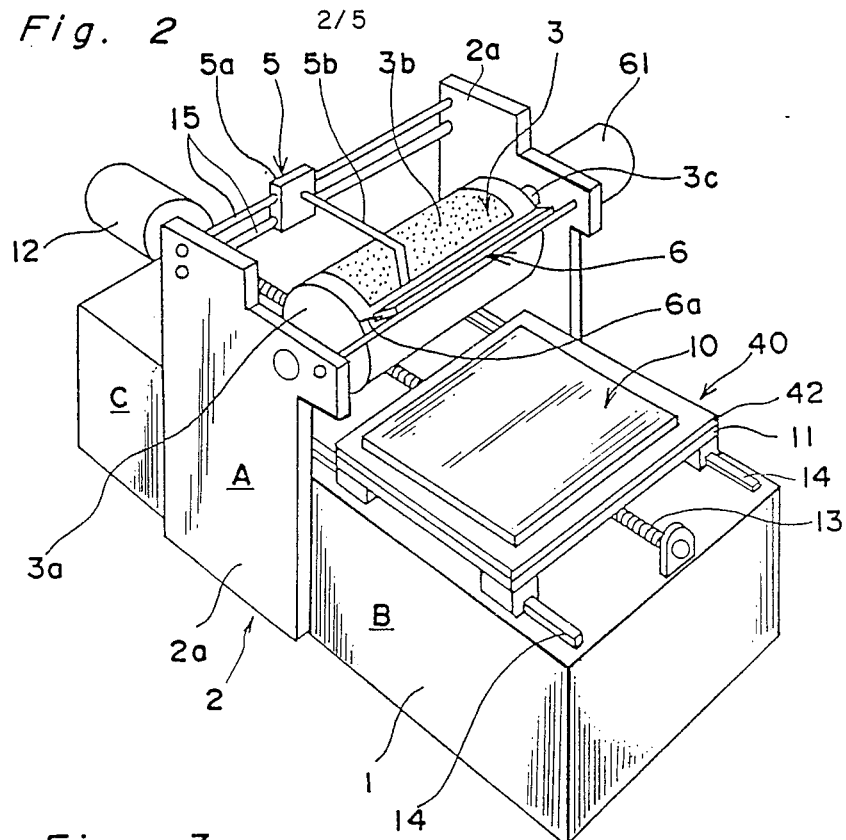
FIG. 2 is a perspective view of a thin-film forming apparatus according to another embodiment of the present invention.

In embodiment 2, as shown in FIG. 2, the base body 1 is provided with a housing 2 on which the intaglio roller 3, ink-supplying device 5, and doctor 6 are supported. A device for driving the intaglio roller comprises driving motor 61. Ink is supplied by ink-supplying device 5 onto the surface of the intaglio roller 3; an excessive amount of ink is scraped off by doctor 6; and thus, ink cells 3b are filled with ink. The surface plate 11 for supporting the material 10 to be printed, made of rigid material such as a glass plate on which the material to be printed is placed, is movably mounted on the base body q at the lower portion of the above-described housing 2. The surface plate 11 is designed so as to be moved by means of the rotating ball screw 13 which is driven by a device for driving the material to be printed, i.e. motor 12 for driving the material to be printed. The surface plate 11 is first, as shown in FIG. 2, moved from the insertion position B to the printing position A for the material to be printed. Next, the above-described intaglio roller 3 with ink is positioned at the printing position A so as to contact the surface of the material 10 to be printed, wherein a thin film having a given pattern is printed and formed on the surface of the material 10 to be printed. Surface plate 11 is driven by the device for driving the material to be printed to move to output position C, where material 10 to be printed is removed. In the course of the above-described processes, the rotation of the intaglio roller 3 and the movement of the surface plate 11 are controlled by the controlling device. The surface plate 11 is then lowered by a height-adjusting means (not illustrated) disposed between the above-described surface plate and rail 14, and is then moved in reverse from the output position C through printing position A to insertion position B.

The component members will be described in greater detail below. The housing 2 comprises a pair of supporting plates 2a which are mounted on the specified central portion of the base body 1 composed of the rectangular-parallelepiped base; the intaglio roller 3 is rotatably supported by the upper portion of housing 2; and the ink-supplying device 5 and doctor 6 are mounted over the intaglio roller 3.

As shown in FIG. 15, the intaglio roller 3 is, in the same manner as in embodiment 1, provided with a plurality of ink cells 3b on its surface. Each ink cell 3b has a depth ranging from approximately five or six microns to approximately fifty or sixty microns. Both ends of the rotation shaft 3c of the intaglio roller 3 are rotatably supported by the housing 2. One end of the rotation shaft 3c protruding outwardly from the housing 2 is connected to a device for driving the intaglio roller comprising the motor 61. Since the intaglio roller 3 is supported only by the housing 2, the replacement work of the roller is simple and easy; furthermore, the replacement work does not affect the positional relationship between the intaglio roller 3 and ink cells 3b. An intaglio roller made of metal coated with ceramics, or a ceramic intaglio roller, as in embodiment 1, may be employed.

The ink-supplying device 5, just as in embodiment 1, comprises an ink-supplying body 5a, ink nozzle 5b, and a pair of guide rails 15. The ink nozzles 5b is mounted as near as possible to the contact position of the intaglio roller 3 and the material 10 to be printed in order to shorten the period during which the ink remains in the ink cells 3b formed on the surface of the intaglio roller 3 in order to prevent the ink from drying. The ink used in this apparatus comprises a mixture composed o synthetic resin, resin precursor, and solvent; the applicable viscosity of the ink ranges from low to high viscosity, more particularly, from approximately five or six c.p.s. to approximately fifty or sixty c.p.s.

The device 40 for supporting the material to be printed is mounted on the base body 1, and comprises the surface plate 11, elastic member 42, and a pair of guide rails 14. The guide rails are mounted on the base body 1, extending continuously from insertion position B, through printing position A, to output position C for the material to be printed. The surface plate 11 is movable mounted on guide rails 14. The surface plate 11 having elastic member 42 fixed on its surface, is driven by a device for driving the material to move from the insertion position B, through printing position A, to output position C for the material to be printed.

The surface plate 11 is moved on the base body 1 along the guide rails 14 by means of a ball screw 13 which is rotated by motor 12 and connected to the surface plate 11, for driving the material to be printed. At this time, the surface plate 11 is set at a given height by the above-described height-adjusting means (not illustrated), so that the surface of the material 10 to be printed placed on the surface plate 11 can contact the lower surface of the intaglio roller 3. Accordingly, when the surface plate 11 is positioned at the printing position A, the material 10 placed on surface plate 11 contacts the intaglio roller 3, transferring the ink deposited in a given pattern on the surface of the intaglio roller 3 onto the surface of the material to be printed, wherein a thin film is printed and formed. Afterwards, the surface 11 is moved to the output position C by means of a device for driving the material to be printed, where material 10 is removed. Then, the surface plate 11 is lowered by the height-adjusting means (not illustrated), and is moved in reverse by means of a device for driving the material to be printed from the output position C to insertion position B. According to this apparatus, the insertion position B and output position C are located at different places, ensuring smooth insertion and removal of work material 10.

The motor 61 for driving the intaglio roller, and motor 12 for driving the material to be printed are controlled by a controlling means, as shown in FIG. 3, so as to control the movement of the surface plate 11 and teh rotation of the intaglio roller 3.

The doctor 6 may employ the same type of doctor blade used in embodiment 1; however the mounting position of the doctor is different from that in embodiment 1.

Figure 12:
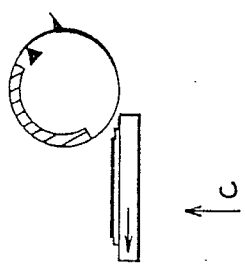
Figure 11:
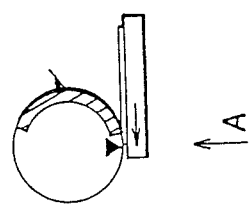
Figure 14:
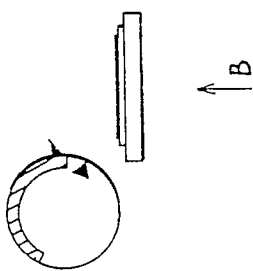
Figure 10:
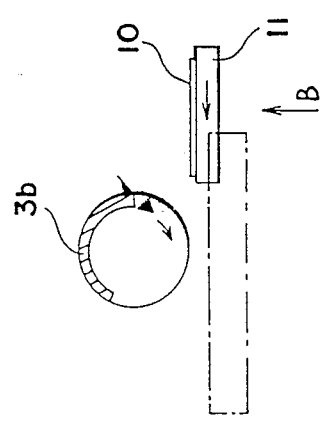
Figure 13:
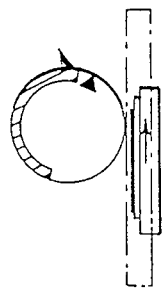

According to the above-described embodiment, as shown in FIG. 10, ink is first supplied by the ink nozzle 5b onto the surface of the intaglio roller 3 having ink cells 3b arranged in a given pattern. Next, the supplied ink is spread over the surface of the intaglio roller 3 by means of the doctor blade 6a so that the ink fills the ink cells. At this time, the ball screw 13 is driven and rotated by the motor 12 for driving the material to be printed, being controlled by the controlling device, and as shown in FIG. 11, the surface plate 11 is moved from the insertion position B to the printing position A. After supplying ink from the ink nozzle 5b onto the surface of the intaglio roller 3, the motor 7 for driving the intaglio roller, and the motor 12 for driving the material to be printed are driven in synchronization with each other, whereby the intaglio roller 3 is rotated, so that surface plate 11 and intaglio roller 3 repeatedly contact each other along the same portion of the surface. At the printing position A, the lower surface of the intaglio roller 3 and the surface of the material 10 to be printed contact each other, wherein the ink deposited in ink cells 3b formed on the surface of the intaglio roller 3 is transferred onto the surface of the material 10, thereby forming a thin film. When the ink is printed on the material in a given pattern, as shown in FIG. 12, the surface plate 11 is moved to the output position C by means of the ball screw 13 being driven by the motor 12, so as to allow the material 10 to be removed from the surface plate 11. During these processes, the intaglio roller 3 rotates to a given position and stops there at in prrparation of the next printing process. On the other hand, the surface plate 11 from which the material 10 is removed is lowered by means of the height-adjusting device (not illustrated) so as not to contact with the intaglio roller 3, and as shown in FIG. 14, is moved from the insertion position C to the output position B, whereby the material 10 is placed on the surface of the surface plate 11 with the aid of the elastic member 42.

According to the above-described embodiment 2, as in embodiment 1, an intaglio roller is used instead of a conventional flat-sheet intaglio palte; accordingly the surface of the roller can be precisely finished. Also, embodiment 2 has an advantage in that the ink is directly printed onto the material in a short time, and the ink is prevented from being dried. Therefore, the ink deposited in the ink cells can be totally transferred onto the material. In addition, when the intaglio roller contacts the material to be printed, the elastic member is deformed, thereby providing an appropriate printing pressure; as a result, a thin film having a given thickness can be precisely printed.

The present invention is not limited to the embodiments described above but can be practiced in other various forms. For example, as a mechanism for moving the surface plate 11 between the insertion position B, printing position A and output position C, the moving means is not limited to the above-described ball screw 13, but other known mechanisms such as a rack-and-pinion mechanism may be employed. Furthermore, as the controlling device, the controlling means is not limited only to one employing a servo unit, but other means may be employed such as a stepping motor for controlling the two drive motors or, instead of using electric signals, a mechanical connection may be employed so that the rotation of the intaglio roller and the movement of the material 10 are synchronized. Also, instead of carrying out the insertion and output operations at two different positions, the operations may be performed at the same position. Furthermore, in embodiment 1, the intaglio roller 3 may be rotated by its own driving motor in synchronization with the printing roller instead of being driven by the motor 7 for driving the printing roller.

What is claimed is:

1. A thin-film forming apparatus for printing a thin film of ink on material to be printed, said apparatus comprising:

a base;

a transfer roller rotatably supported by said base, said transfer roller having an outer surface, and an intaglio exposed at the outer surface thereof and defined by a plurality of recesses extending in said outer surface in a predetermined pattern;

an ink-supplying device disposed in the apparatus in communication with said transfer roller for supplying ink having a relatively low viscosity to the outer surface of said transfer roller;

a doctor mounted in the apparatus over said transfer roller for spreading ink, supplied onto the outer surface of said transfer roller by said ink-supplying device, over said outer surface and for causing the recesses defining the intaglio to be filled with a predetermined amount of ink;

a printing roller rotatably supported by said base and having an outer surface that extends below the outer surface of said transfer roller, the outer surface of said printing roller including a convex portion that is engageable with the intaglio of said transfer roller so as to receive, in said predetermined pattern, ink contained in said recesses defining the intaglio of said transfer roller;

first driving means operatively connected to said transfer roller and to said printing roller for synchronously rotating said transfer roller and said printing roller;

a surface plate movably mounted on said base and having a top surface for supporting material to be printed;

second driving means operatively connected to said surface plate for moving said surface plate between an insertion position at which material to be printed is disposable on the top surface of said surface plate, a printing position confronting said printing roller and an output position at which material supported on the top surface of said surface plate is removable therefrom; and control means operatively connected to said first and said second driving means for controlling the same to rotate said printing roller and move said surface plate in a manner in which the convex portion of said printing roller confronts said surface plate when at said printing position so that material supported by said surface plate at said printing position is printed with ink, in said predetermined pattern, received on the convex portion of said printing roller.

2. A thin-film forming apparatus as claimed in claim wherein said transfer roller comprises a ceramic roller.

3. A thin-film forming apparatus as claimed in claim 1, wherein said transfer roller comprises a metal roller having a coating of ceramic material disposed thereover.

4. A thin-film forming apparatus as claimed in claim 1, wherein said doctor comprises a ceramic blade.

5. A thin-film forming apparatus as claimed in claim 1, wherein said doctor comprises a metal blade having a coating of ceramic material disposed thereover.

6. A thin-film forming apparatus for printing a thin film of ink on material to be printed, said apparatus comprising:
a base;
a transfer roller rotatably supported by said base, said transfer roller having an outer surface, and an intaglio exposed at the outer surface thereof and defined by a plurality of recesses extending in said outer surface in a predetermined pattern;
an ink-supplying device disposed in the apparatus in communication with said transfer roller for supplying ink having a relatively low viscosity to the outer surface of said transfer roller;
a doctor mounted in the apparatus over said transfer roller for spreading ink, supplied onto the outer surface of said transfer roller by said ink-supplying device, over said outer surface and for causing the recesses defining the intaglio to be filled with a predetermined amount of ink;
first driving means operatively connected to said transfer roller for rotating said transfer roller;
a surface plate movably mounted on said base and having an elastic top surface for supporting material to be printed;
second driving means operatively connected to said surface plate for moving said surface plate between an insertion position at which material to be printed is disposable on the top surface of said surface plate, a printing position confronting said transfer roller, and an output position at which material supported on the top surface of said surface plate is removable therefrom; and
control means operatively connected to said first and said second driving means for controlling the same to rotate said transfer roller and move said surface plate in a manner in which the intaglio of said transfer roller confronts said surface plate when at said printing position so that material supported by said surface plate at said printing position is printed with ink, in said predetermined pattern, transferred thereto by said transfer roller.

7. A thin-film forming apparatus as claimed in claim 6, wherein said transfer roller comprises a ceramic roller.

8. A thin-film forming apparatus as claimed in claim 6, wherein said transfer roller comprises a metal roller having a coating of ceramic material disposed thereover.

9. A thin-film forming apparatus as claimed in claim 6, wherein said doctor comprises a ceramic blade.

10. A thin-film forming apparatus as claimed in claim 6, wherein said doctor comprises a metal blade having a coating of ceramic material disposed thereover.

* * * * *

UNITED STATES PATENT AND TRADEMARK OFFICE
CERTIFICATE OF CORRECTION

PATENT NO. : 4,841,857

DATED : June 27, 1989

INVENTOR(S) : Yasuhiro HASHIMURA et al.

It is certified that error appears in the above-identified patent and that said Letters Patent is hereby corrected as shown below:

On the first page of the patent document, below the publication data of the PCT application, the following priority data has been added:

--[30] Foreign Application Priority Data
   March 3, 1986 [JP] Japan.........................61-46806
   December 27, 1986 [JP] Japan....................61-309368--.

Signed and Sealed this

Twelfth Day of June, 1990

Attest:

HARRY F. MANBECK, JR.

*Attesting Officer*            *Commissioner of Patents and Trademarks*